United States Patent
Hwangbo et al.

(10) Patent No.: US 11,152,256 B2
(45) Date of Patent: Oct. 19, 2021

(54) CARRIER FILM, ELEMENT TRANSFER METHOD USING SAME, AND ELECTRONIC PRODUCT MANUFACTURING METHOD USING ELEMENT TRANSFER METHOD

(71) Applicants: KOREA INSTITUTE OF MACHINERY & MATERIALS, Daejeon (KR); Center for Advanced Meta-Materials, Daejeon (KR)

(72) Inventors: Yun Hwangbo, Daejeon (KR); Byung-Ik Choi, Daejeon (KR); Jae-Hyun Kim, Daejeon (KR); Hak Joo Lee, Daejeon (KR); Bongkyun Jang, Daejeon (KR); Yeon Woo Jeong, Daejeon (KR); Seong Min Hong, Daejeon (KR)

(73) Assignees: KOREA INSTITUTE OF MACHINERY & MATERIALS, Daejeon (KR); CENTER FOR ADVANCED META-MATERIALS, Daejeon (KR)

(*) Notice: Subject to any disclaimer, the term of this patent is extended or adjusted under 35 U.S.C. 154(b) by 30 days.

(21) Appl. No.: 16/341,714

(22) PCT Filed: Oct. 18, 2017

(86) PCT No.: PCT/KR2017/011532
§ 371 (c)(1),
(2) Date: Apr. 12, 2019

(87) PCT Pub. No.: WO2018/074841
PCT Pub. Date: Apr. 26, 2018

(65) Prior Publication Data
US 2020/0043780 A1    Feb. 6, 2020

(30) Foreign Application Priority Data
Oct. 18, 2016 (KR) .......................... 10-2016-0135330

(51) Int. Cl.
*H01L 21/447*    (2006.01)
*H01L 21/768*    (2006.01)
(Continued)

(52) U.S. Cl.
CPC .......... *H01L 21/76841* (2013.01); *C09J 7/20* (2018.01); *H01L 21/447* (2013.01);
(Continued)

(58) Field of Classification Search
CPC ... H01L 21/447; H01L 21/48; H01L 21/4867; H01L 21/67092; H01L 21/67132;
(Continued)

(56) References Cited

U.S. PATENT DOCUMENTS

| | | | |
|---|---|---|---|
| 2008/0081400 A1* | 4/2008 | Doi | .................. H01L 24/82 438/118 |
| 2010/0123268 A1 | 5/2010 | Menard | |
| 2015/0107963 A1* | 4/2015 | Hanisch | ................. B65G 15/42 198/605 |

FOREIGN PATENT DOCUMENTS

| | | |
|---|---|---|
| JP | 2006-330157 A | 12/2006 |
| JP | 2007-314728 A | 12/2007 |

(Continued)

OTHER PUBLICATIONS

International Search Report for PCT/KR2017/011532 dated Feb. 26, 2018.

*Primary Examiner* — Matthew C Landau
*Assistant Examiner* — Dmitriy Yemelyanov
(74) *Attorney, Agent, or Firm* — Hauptman Ham, LLP

(57) ABSTRACT

A carrier film according to an embodiment of the present invention comprises: a base film; and a first adhesive layer formed on a surface of the base film such that an element to be transferred is attached to the first adhesive layer, wherein the magnitude of force of adhesion between the element and
(Continued)

the first adhesive layer is in proportion to the depth of press-fitting at which the element is press-fitted into the first adhesive layer.

7 Claims, 17 Drawing Sheets

(51) Int. Cl.
    *C09J 7/20*           (2018.01)
    *H01L 21/48*         (2006.01)
    *H01L 21/67*         (2006.01)

(52) U.S. Cl.
    CPC .... *H01L 21/4867* (2013.01); *H01L 21/67092* (2013.01); *H01L 21/76817* (2013.01)

(58) Field of Classification Search
    CPC ............. H01L 21/768; H01L 21/76817; H01L 21/76841; H01L 33/0095; H01L 21/67; C09J 7/20
    See application file for complete search history.

(56) References Cited

FOREIGN PATENT DOCUMENTS

| | | |
|---|---|---|
| JP | 4082242 B2 | 4/2008 |
| JP | 2015-067070 A | 4/2015 |
| KR | 10-2004-0090660 A | 10/2004 |
| KR | 10-2009-0132931 A | 12/2009 |
| KR | 10-2016-0080265 A | 7/2016 |
| WO | 2016/121579 A1 | 8/2016 |

\* cited by examiner

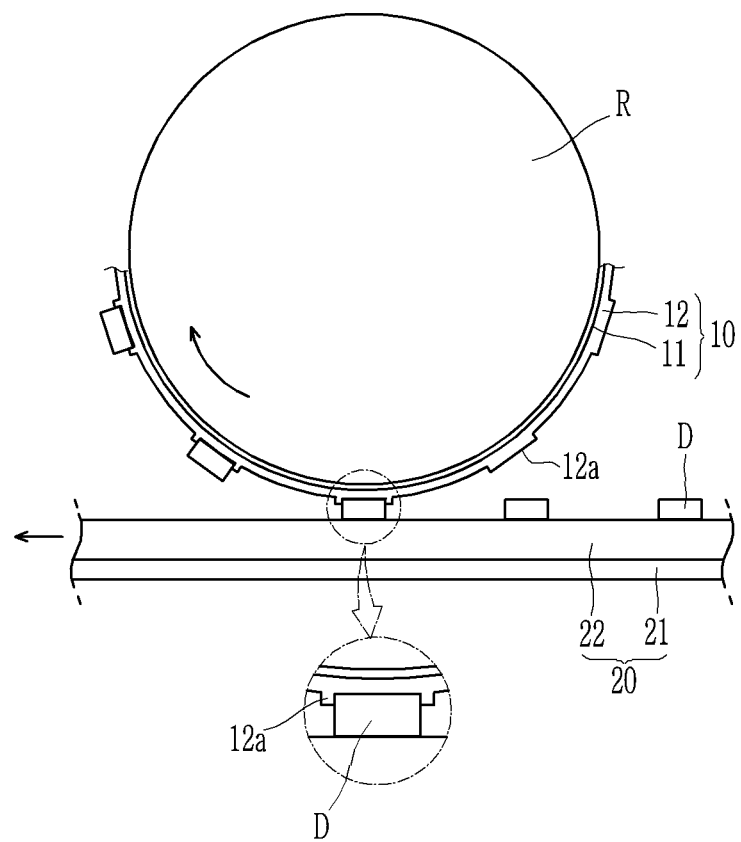

CARRIER FILM, ELEMENT TRANSFER METHOD USING SAME, AND ELECTRONIC PRODUCT MANUFACTURING METHOD USING ELEMENT TRANSFER METHOD

CROSS REFERENCE TO RELATED APPLICATION

This present application is a national stage filing under 35 U.S.C § 371 of PCT application number PCT/KR2017/011532 filed on Oct. 18, 2017 which is based upon and claims the benefit of priority to Korean Patent Application No. 10-2016-0135330 filed on Oct. 18, 2016 in the Korean Intellectual Property Office. The disclosures of the above-listed applications are hereby incorporated by reference herein in their entirety.

TECHNICAL FIELD

The present invention relates to a carrier film, a device transfer method using the carrier film, and a method of manufacturing an electronic product using the device transfer method, and more particularly, to a carrier film, a device transfer method using the carrier film, and a method of manufacturing an electronic product using the device transfer method, for adjusting adhesiveness by controlling a press fitting depth by which a device is press-fit into a carrier film and a substrate to transfer the device to the substrate.

BACKGROUND ART

In general, a display using a micro light emitting diode (LED) has attracted an attention as a next-generation high-tech display to replace a conventional display. To manufacture such a micro LED display, transfer of each LED to a modularized circuit board is a core technology.

The adhesiveness of an adhesive carrier film that is used in a conventional transfer process is adjustable only via a change in chemical composition of an adhesive layer, and thus, generally, adhesive layers having the same chemical composition always have the same adhesiveness.

Accordingly, when a device is moved between a carrier film and a substrate using a conventional adhesive carrier film, it is possible to move the device only toward a side with relatively high adhesiveness from a side with a relatively low adhesiveness among the carrier film and the substrate, and an opposite case is not possible in principle.

Accordingly, it is required to find an adhesive layer having appropriate adhesiveness depending on a device that is a transfer target, and with regard to an adhesive layer that does not conventionally exist, it is difficult to adjust a chemical composition and to directly manufacture the adhesive layer.

In the case of an adhesive layer with predetermined adhesiveness, it is not possible to prevent a problem in that adhesiveness is changed when a device as a transfer target is changed, and thus, there is a problem in that it is difficult to move and transfer various types of devices.

DISCLOSURE

Technical Problem

An exemplary embodiment of the present invention provides a carrier film for adjusting adhesiveness by controlling a press fitting depth by which a device is press-fit into a carrier film and a substrate, and controlling movement of the device to the carrier film or the substrate to transfer the device to a desired substrate.

Another embodiment of the present invention provides a device transfer method using the carrier film, and a method of manufacturing an electronic product using the device transfer method.

Technical Solution

According to an embodiment of the present invention, a carrier film includes a base film, and a first adhesive layer that is formed on one surface of the base film and to which a device as a transfer target is attached, wherein an adhesiveness formed between the device and the first adhesive layer is proportional to a press fitting depth by which the device is press-fit into the first adhesive layer.

According to another embodiment of the present invention, a device transfer method includes pressurizing a carrier film including a base film and a first adhesive layer formed on one surface of the base film, and a substrate including a base surface and a second adhesive layer formed on the base surface against each other to permit the first adhesive layer and the second adhesive layer to face each other and to position a device as a transfer target between the first adhesive layer and the second adhesive layer, forming first adhesiveness between the device and the first adhesive layer as the device is press-fit into the first adhesive layer via the pressurizing, forming second adhesiveness between the device and the second adhesive layer as the device is press-fit into the second adhesive layer via the pressurizing, and releasing the device from the first adhesive layer or the second adhesive layer by spacing the carrier film apart from the substrate, wherein the first adhesiveness is proportional to a first press fitting depth by which the device is press-fit into the first adhesive layer, and the second adhesiveness is proportional to a second press fitting depth by which the device is press-fit into the second adhesive layer, and the device is moved between the first adhesive layer and the second adhesive layer by a relative difference between the first press fitting depth and the second press fitting depth.

A viscoelastic coefficient of the first adhesive layer and a viscoelastic coefficient of the second adhesive layer may be adjusted to be different from each other to differently configure the first press fitting depth and the second press fitting depth with respect to the device.

Yield strength of the first adhesive layer and yield strength of the second adhesive layer may be adjusted to be different from each other to differently configure the first press fitting depth and the second press fitting depth with respect to the device.

The first adhesive layer and the second adhesive layer may have different thicknesses, the pressurizing may include applying greater applied pressure than threshold applied pressure for press-fitting the device by a thickness of an adhesive layer with a smaller thickness among the first adhesive layer and the second adhesive layer, to the carrier film and the substrate, and a press fitting depth by which the device is press-fit into an adhesive layer with a greater thickness among the first adhesive layer and the second adhesive layer may be greater than a press fitting depth by which the device is press-fit into an adhesive layer with a smaller thickness among the first adhesive layer and the second adhesive layer.

The first adhesive layer or the second adhesive layer may be formed of a material with a hardening degree that is changed depending on heat applied to the first adhesive layer or the second adhesive layer, and the heat applied to the first adhesive layer or the second adhesive layer may be adjusted to differently configure the first press fitting depth and the second press fitting depth with respect to the device.

The first adhesive layer and the second adhesive layer may be formed of a material with a hardening degree that is changed depending on wavelengths of light applied to the first adhesive layer and the second adhesive layer, and the wavelengths of light emitted to the first adhesive layer and the second adhesive layer may be adjusted to be different from each other to differently configure the first press fitting depth and the second press fitting depth with respect to the device.

The carrier film may be disposed to surround a cylindrical roller, and a flat protrusion portion protruding from a curved surface of the first adhesive layer may be included to press-fit an entire portion of one surface of the device, which contacts the first adhesive layer via the pressurizing, by a uniform depth.

According to another embodiment of the present invention, a method of manufacturing an electronic product includes transferring a plurality of devices on a flat plate using the device transfer method to manufacture an electronic product.

Advantageous Effects

According to an exemplary embodiment of the present invention, a large amount of micro devices may be transferred to a desired substrate using a combination of a roller and a flat plate to perform consecutive processes.

In addition, completely differently from adhesiveness that is chemically adjusted according to the prior art, a device may be transferred to a substrate or a carrier film using adhesiveness generated by mechanical deformation among the device, the carrier film, and the substrate.

DESCRIPTION OF THE DRAWINGS

FIG. 16 is a diagram showing movement of a carrier film using a roller in the device transfer method of FIG. 2.

MODE FOR INVENTION

Figure 1:
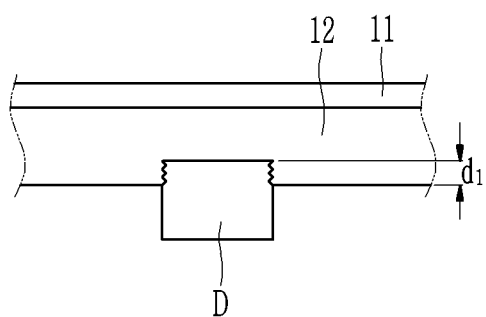
FIG. 1 is a diagram showing a carrier film according to an exemplary embodiment of the present invention.

Exemplary embodiments of the present invention are described in detail so as for those of ordinary skill in the art to easily implement with reference to the accompanying drawings. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Sizes and thicknesses of the elements shown in the drawings are for the purpose of descriptive convenience, and thus the present invention is not necessarily limited thereto.

In the specification, when it is described that a certain part is "connected" to another part, it should be understood that the certain part may be "directly connected" to another part or "indirectly connected" to another part via another part in the middle. In addition, unless explicitly described to the contrary, the word "comprise" and variations such as "comprises" or "comprising", will be understood to imply the inclusion of stated elements but not the exclusion of any other elements.

In the specification, when an element such as a layer, a film, a region, and a board is referred to as being "on" another element, the element can be "directly on" another element or intervening elements. In addition, the term "above" encompasses both an orientation of above and below and does not necessarily encompass the orientation of above with respect to a direction of gravity.

FIG. 1 is a diagram showing a carrier film according to an exemplary embodiment of the present invention.

As shown in FIG. 1, the carrier film according to the present invention may include a base film 11 and a first adhesive layer 12 which is formed on one surface of the base film 11 and to which a device D as a transfer target is to be attached.

The device D may be press-fit into the first adhesive layer 12 by external pressure, and an adhesiveness formed between the device D and the first adhesive layer 12 may be proportional to a press fitting depth $d_1$ by which the device D is press-fit into the first adhesive layer 12.

In detail, as the press fitting depth $d_1$ of the device D with respect to the first adhesive layer 12 is increased, a contact area between the first adhesive layer 12 and an edge portion of the device D may be increased, and accordingly, frictional force between the device D and the first adhesive layer 12 may be increased.

Accordingly, as the press fitting depth $d_1$ is increased, greater frictional force may be generated, and thus, an adhesiveness formed between the device D and the first adhesive layer 12 may be increased.

Here, a portion at which the adhesiveness between the device D and the first adhesive layer 12 is mainly generated may refer to a portion indicated by a wave pattern of FIG. 1.

Hereinafter, a device transfer method according to the present invention will be described with reference to the attached drawings.

Figure 2:
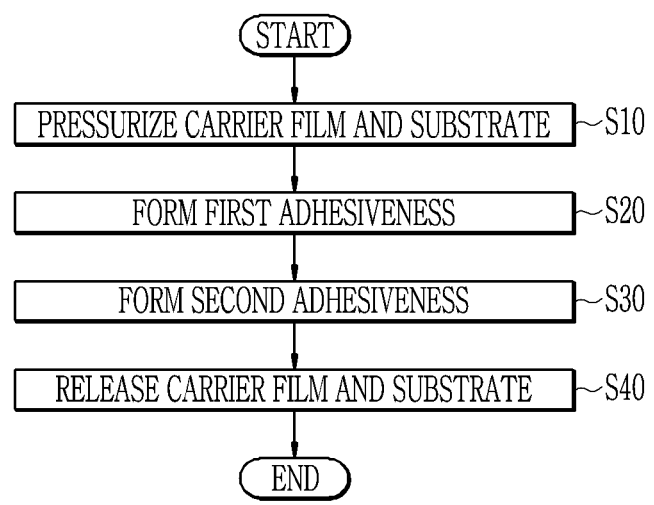
FIG. 2 is a flowchart of a device transfer method according to an exemplary embodiment of the present invention.
Figure 3A:
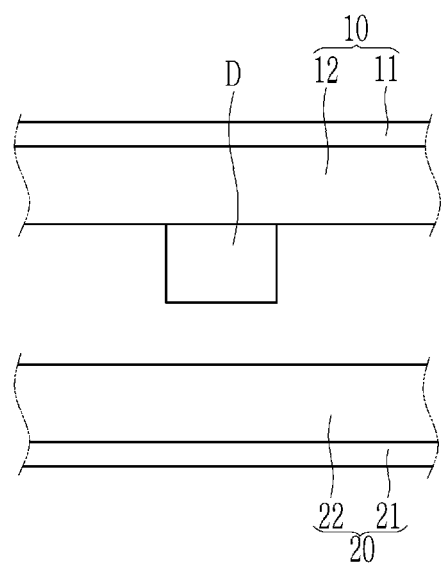
FIGS. 3A and 3B are diagrams showing a state prior to a pressurization operation of the device transfer method of FIG. 2.
Figure 3B:
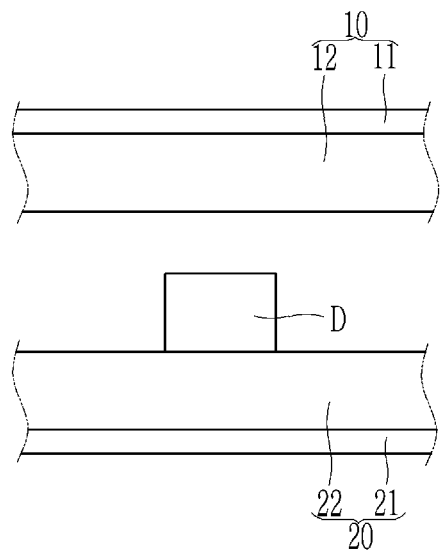
Figure 4:
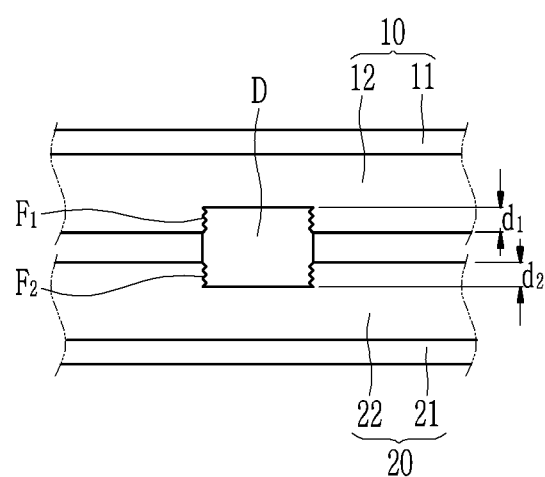
FIG. 4 is a diagram showing a state after the pressurization operation of the device transfer method of FIG. 2.

FIG. 2 is a flowchart of a device transfer method according to an exemplary embodiment of the present invention. FIGS. 3A and 3B are diagrams showing a state prior to a pressurization operation of the device transfer method of FIG. 2. FIG. 4 is a diagram showing a state after the pressurization operation of the device transfer method of FIG. 2.

As shown in FIG. 2, the device transfer method according to the present invention may include a pressurization operation S10, a first adhesiveness forming operation S20, a second adhesiveness forming operation S30, and a releasing operation S40.

First, as shown in FIG. 3A, the carrier film 10 to which the device D is attached and a substrate 20 including a base surface 21 on which a second adhesive layer 22 is coated may be prepared, and the carrier film 10 and the substrate 20 may be aligned in parallel.

In the pressurization operation S10, the carrier film 10 including the base film 11 and the first adhesive layer 12 formed on one surface of the base film 11, and the substrate 20 including the base surface 21 and the second adhesive layer 22 formed on one surface of the base surface 21 may be pressurized against each other such that the first adhesive layer 12 and the second adhesive layer 20 face each other.

Here, the device D as a transfer target may be positioned between the first adhesive layer 12 and the second adhesive layer 22. For example, the device D may be attached to the first adhesive layer 12 or the second adhesive layer 22. That is, as shown in FIG. 3A, the pressurization operation S10 may be performed in a state in which the device D is attached to the first adhesive layer 12, or as shown in FIG. 3B, the pressurization operation S10 may be performed in a state in which the device D is attached to the second adhesive layer 22.

As shown in FIG. 4, in the first adhesiveness forming operation S20, as the device D pressurized in the pressurization operation S10 is press-fit into the first adhesive layer 12, first adhesiveness $F_1$ may be formed between the device D and the first adhesive layer 12.

In the second adhesiveness forming operation S30, as the device D pressurized in the pressurization operation S10 is press-fit into the second adhesive layer 22, second adhesiveness $F_2$ may be formed between the device D and the second adhesive layer 22.

A size of the first adhesiveness $F_1$ may be proportional to the first press fitting depth $d_1$ by which the device D is press-fit into the first adhesive layer 12, and a size of the second adhesiveness $F_2$ may be proportional to the second press fitting depth $d_2$ by which the device D is press-fit into the second adhesive layer 22.

Even if the same applied pressure is applied to the device D with respect to the first adhesive layer 12 and the second adhesive layer 22, the first press fitting depth $d_1$ and the second press fitting depth $d_2$ may be different depending on physical property values or materials of the first adhesive layer 12 and the second adhesive layer 22, and thus, the first adhesiveness $F_1$ and the second adhesiveness $F_2$ may be different.

In the releasing operation S40, the device D may be separated from the first adhesive layer 12 or the second adhesive layer 22 by spacing the carrier film 10 apart from the substrate 20, and an adhesive layer released from the device D may be determined by a relative difference between the first adhesiveness $F_1$ and the second adhesiveness $F_2$.

That is, when the first adhesiveness $F_1$ is greater than the second adhesiveness $F_2$ with respect to the device D, the device D may be transferred to the first adhesive layer 12 while being released from the second adhesive layer 22, and when the first adhesiveness $F_1$ is smaller than the second adhesiveness $F_2$ with respect to the device D, the device D may be transferred to the second adhesive layer 22 while being released from the first adhesive layer 12.

Figure 5A:
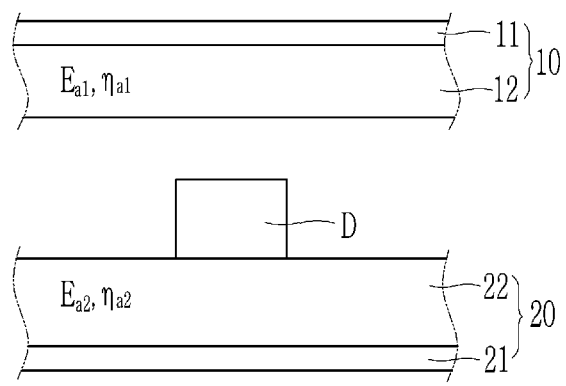
FIGS. 5A, 5B and 5C are diagrams of first and second adhesive layers in the device transfer method of FIG. 2 according to a first exemplary embodiment.
Figure 5B:
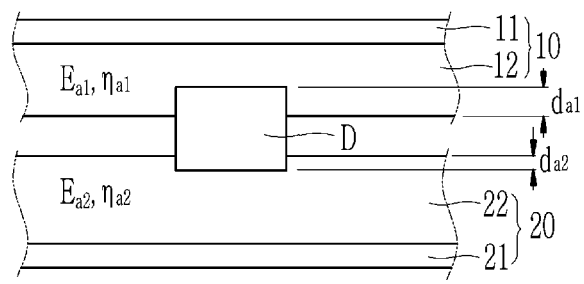
Figure 5C:
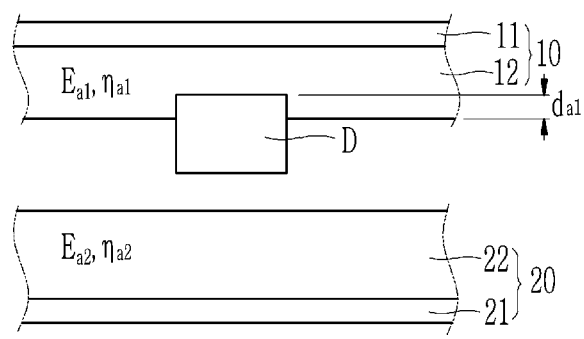
Figure 6A:
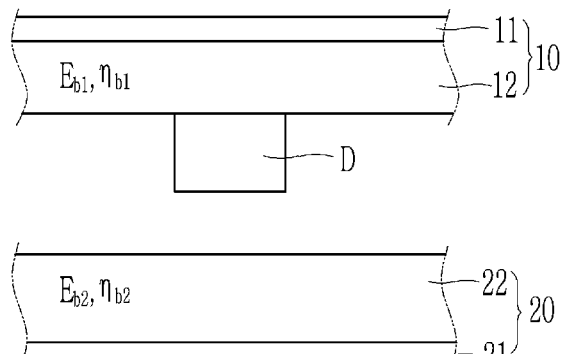
FIGS. 6A, 6B and 6C are diagrams of first and second adhesive layers in the device transfer method of FIG. 2 according to a modified example of the first exemplary embodiment.
Figure 6B:
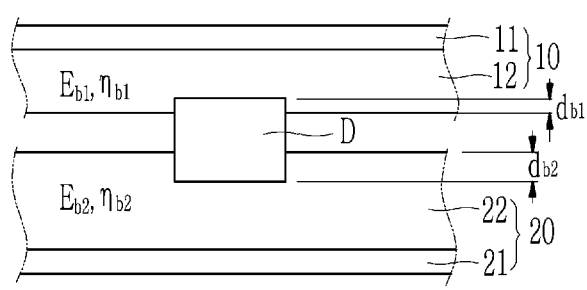
Figure 6C:
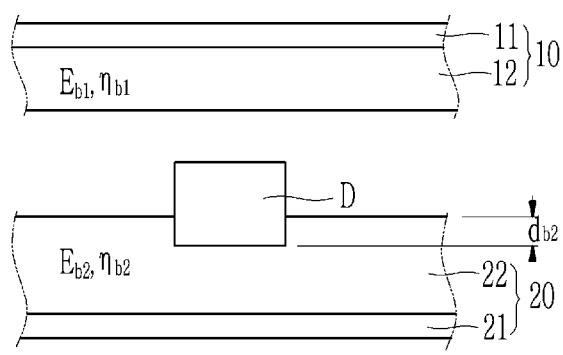

FIGS. 5A, 5B and 5C are diagrams of first and second adhesive layers in the device transfer method of FIG. 2 according to a first exemplary embodiment. FIGS. 6A, 6B and 6C are diagrams of first and second adhesive layers in the device transfer method of FIG. 2 according to a modified example of the first exemplary embodiment.

With reference to FIGS. 5A to 6C, the first adhesive layer 12 and the second adhesive layer 22 which have different viscoelastic coefficients according to the first exemplary embodiment will be described below.

As shown in FIG. 5A, the device D may be attached to the second adhesive layer 22, and a first viscoelastic coefficient $(E_{a1}, \eta_{a1})$ of the first adhesive layer 12 may have a smaller value than a second viscoelastic coefficient $E_{a2}$ and $\eta_{a2}$ of the second adhesive layer 22.

As such, the first adhesive layer 12 and the second adhesive layer 22 may be formed of a viscoelastically deformed material to press-fit the device into the first adhesive layer 12 and the second adhesive layer 22 via the pressurization operation S10.

As shown in FIG. 5B, the device D that goes through the pressurization operation S10 may be press-fit into the first adhesive layer 12 and the second adhesive layer 22, and the first press fitting depth $d_{a1}$ and the second press fitting depth $d_{a2}$ may be different due to a relative difference between the first viscoelastic coefficient $(E_{a1}, \eta_{a1})$ and the second viscoelastic coefficient $(E_{a2}, \eta_{a2})$.

Since the first viscoelastic coefficient $(E_{a1}, \eta_{a1})$ is smaller than the second viscoelastic coefficient $(E_{a2}, \eta_{a2})$, the first press fitting depth $d_{a1}$ may be greater than the second press fitting depth $d_{a2}$, and thus, the first adhesiveness may be greater than the second adhesiveness, and as the releasing operation S40 is performed, the device D may be released from the second adhesive layer 22 in a state in which the device D is attached to the first adhesive layer 12, as shown in FIG. 5C.

Like in the aforementioned first exemplary embodiment, a process in which the device D is released from the substrate 20 and is transferred to the carrier film 10 may be used in a picking process of transferring a device attached to a source substrate to a carrier film during a general semiconductor process.

The present invention is not limited thereto, and as shown in FIGS. 6A to 6C, the device D may be attached to the first adhesive layer 12, and a first viscoelastic coefficient ($E_{b1}$, $\eta_{b1}$) of the first adhesive layer 12 may have a greater value than a second viscoelastic coefficient ($E_{b2}$, $\eta_{b2}$) of the second adhesive layer 22.

Accordingly, the first adhesiveness of the device D may be smaller than the second adhesiveness of the device D due to a difference between the first press fitting depth $d_{b1}$ and the second press fitting depth $d_{b2}$, and as the releasing operation S40 is performed, the device D may be released from the first adhesive layer 12 in a state in which the device D is attached to the second adhesive layer 22.

As such, a process in which the device D is released from the carrier film 10 and is transferred to the substrate 20 may be used in a placing process of transferring a device attached to a carrier film to a target substrate during a general semiconductor process.

Resultantly, viscoelastic coefficients of the first adhesive layer 12 and the second adhesive layer 22 may be adjusted to control press fitting depths of the device D, and thus, a direction in which the device D is transferred may be determined and the device D may be reused depending on the physical properties of the first adhesive layer 12 and the second adhesive layer 22 that are viscoelastically deformed.

Figure 7A:
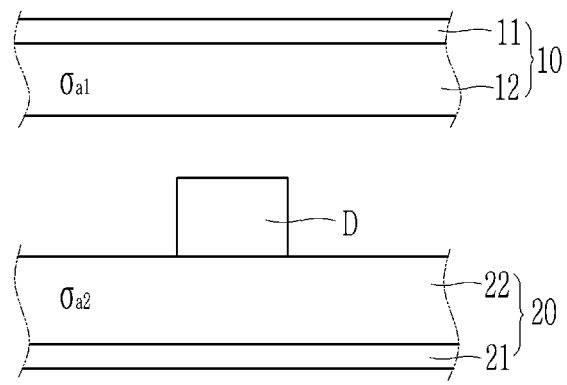
FIGS. 7A, 7B and 7C are diagrams of first and second adhesive layers in the device transfer method of FIG. 2 according to a second exemplary embodiment.
Figure 7B:
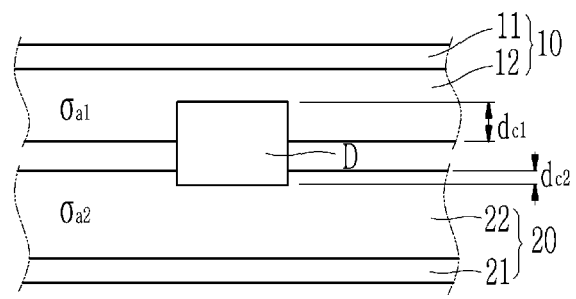
Figure 7C:
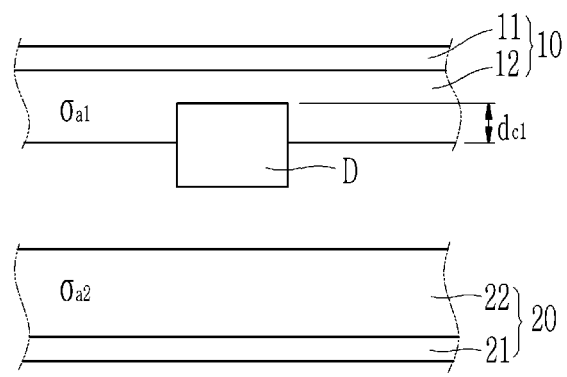
Figure 8A:
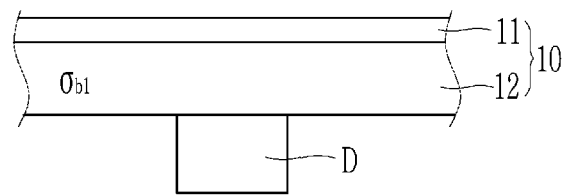
FIGS. 8A, 8B and 8C are diagrams of first and second adhesive layers in the device transfer method of FIG. 2 according to a modified example of the second exemplary embodiment.
Figure 8B:
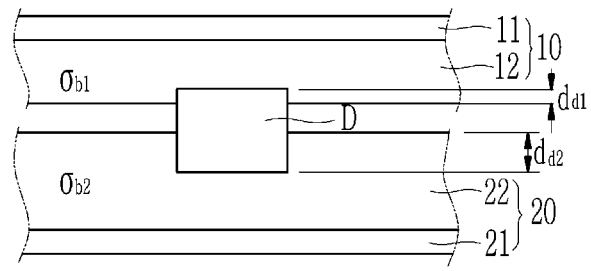
Figure 8C:
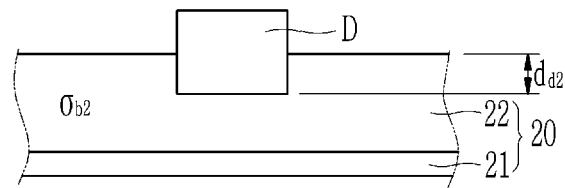

FIGS. 7A, 7B and 7C are diagrams of first and second adhesive layers in the device transfer method of FIG. 2 according to a second exemplary embodiment. FIGS. 8A, 8B and 8C is a diagram of first and second adhesive layers in the device transfer method of FIG. 2 according to a modified example of the second exemplary embodiment.

With reference to FIGS. 7A to 8C, the first adhesive layer 12 and the second adhesive layer 22 which have different yield strengths according to the second exemplary embodiment will be described below.

As shown in FIG. 7A, the device D may be attached to the second adhesive layer 22, and first yield strength $\sigma_{a1}$ of the first adhesive layer 12 may have a smaller value than second yield strength $\sigma_{a2}$ of the second adhesive layer 22.

As such, the first adhesive layer 12 and the second adhesive layer 22 may be formed of a plastically deformed material to press-fit the device into the first adhesive layer 12 and the second adhesive layer 22 via the pressurization operation S10.

As shown in FIG. 7B, the device D that goes through the pressurization operation S10 may be press-fit into the first adhesive layer 12 and the second adhesive layer 22, and the first press fitting depth $d_{a1}$ and the second press fitting depth $d_{a1}$ may be different due to a relative difference between the first yield strength $\sigma_{a1}$ and the second yield strength $\sigma_{a2}$.

Since the first yield strength $\sigma_{a1}$ is smaller than the second yield strength $\sigma_{a2}$, the first press fitting depth $d_{c1}$ may be greater than the second press fitting depth $d_{c2}$, and thus, the first adhesiveness may be greater than the second adhesiveness, and as the releasing operation S40 is performed, the device D may be released from the second adhesive layer 22 in a state in which the device D is attached to the first adhesive layer 12, as shown in FIG. 7C.

The present invention is not limited thereto, and as shown in FIGS. 8A, 8B and 8C, the device D may be attached to the first adhesive layer 12, and the first yield strength $\sigma_{b1}$ of the first adhesive layer 12 may have a greater value than the second yield strength $\sigma_{b2}$ of the second adhesive layer 22.

Accordingly, the first adhesiveness of the device D may be smaller than the second adhesiveness of the device D due to a difference between the first press fitting depth $d_{d1}$ and the second press fitting depth $d_{d2}$, and as the releasing operation S40 is performed, the device D may be released from the first adhesive layer 12 in a state in which the device D is attached to the second adhesive layer 22.

Resultantly, yield strengths of the first adhesive layer 12 and the second adhesive layer 22 may be adjusted to control press fitting depths of the device D, and thus, a direction in which the device D is transferred may be determined.

Figure 9:
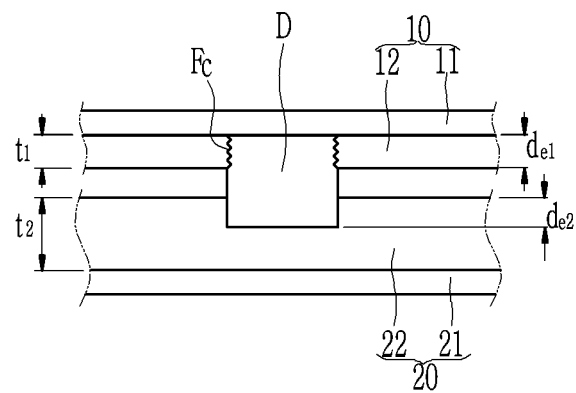
FIG. 9 is a diagram for explanation of threshold applied pressure in the device transfer method of FIG. 2.
Figure 10A:
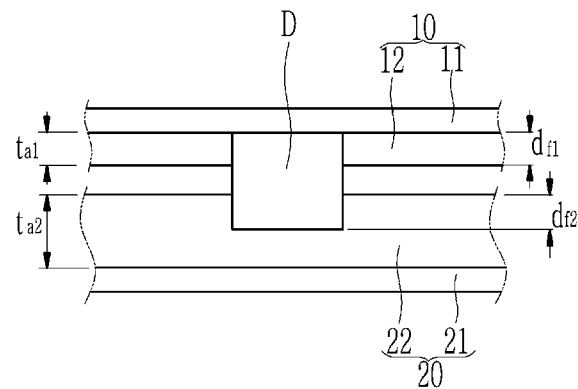
FIGS. 10A and 10B are diagrams of first and second adhesive layers of the device transfer method of FIG. 2 according to a third exemplary embodiment.
Figure 10B:
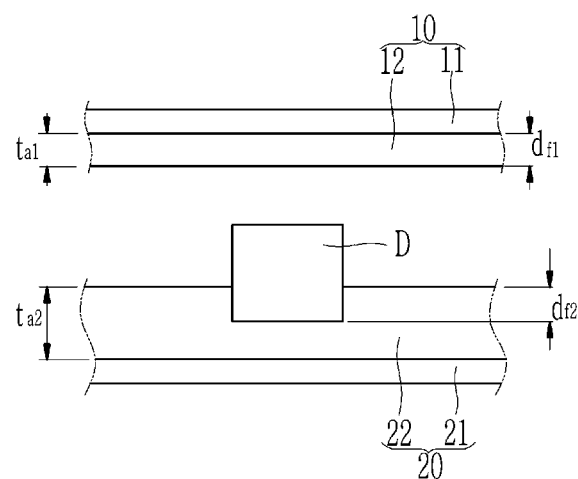
Figure 11A:
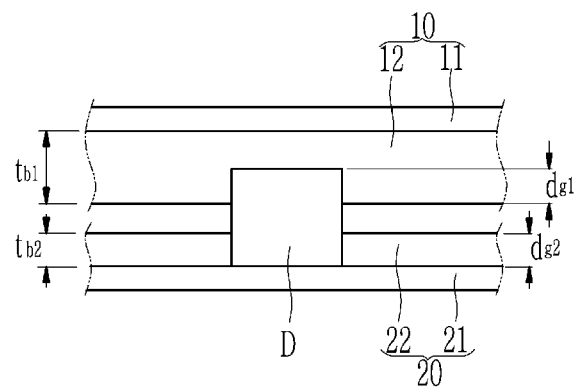
FIGS. 11A and 11B are diagrams of first and second adhesive layers of the device transfer method of FIG. 2 according to a modified example of a third exemplary embodiment.
Figure 11B:
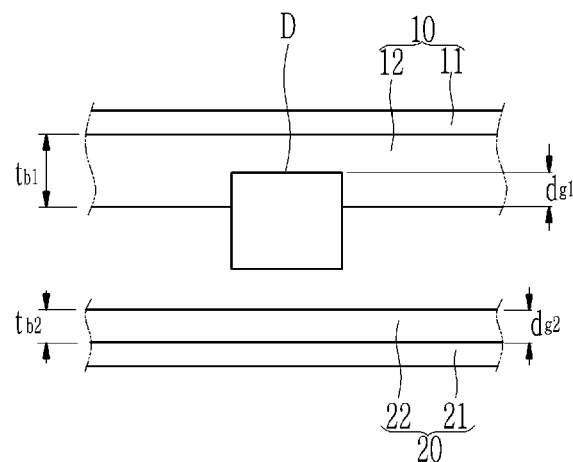

FIG. 9 is a diagram for explanation of threshold applied pressure in the device transfer method of FIG. 2. FIGS. 10A and 10B are diagrams of first and second adhesive layers of the device transfer method of FIG. 2 according to a third exemplary embodiment. FIGS. 11A and 11B are diagrams of first and second adhesive layers of the device transfer method of FIG. 2 according to a modified example of a third exemplary embodiment.

With reference to FIGS. 9 to 11B, the first adhesive layer 12 and the second adhesive layer 22 which have different thicknesses according to the third exemplary embodiment will be described below.

First, with reference to FIG. 9, the threshold applied pressure is described below.

Throughout this specification, the threshold applied pressure refers to applied pressure with amplitude for press-fitting the device D by a depth of an adhesive layer with a smaller thickness among the first adhesive layer 12 and the second adhesive layer 22 when conditions such as yield strengths and viscoelastic coefficients of the first adhesive layer 12 and the second adhesive layer 22 are the same and a thickness $t_1$ of the first adhesive layer 12 and a thickness $t_2$ of the second adhesive layer 22 are different.

When the first adhesive layer 12 and the second adhesive layer 22 have the same thickness and a carrier film and a substrate are pressurized with threshold applied pressure, the first press fitting depth $d_{e1}$ and the second press fitting depth $d_{e2}$ have the same value, and thus, a size $F_c$ of adhesiveness formed between the device and the first adhesive layer and a size $F_c$ of adhesiveness formed between the device and the second adhesive layer may be the same.

Needless to say, even if smaller applied pressure than the threshold applied pressure is applied to the carrier film 10 and the substrate 20, the first press fitting depth $d_{e1}$ and the second press fitting depth $d_{e2}$ have the same size, and thus, adhesiveness formed between the device D and the first adhesive layer 12 and adhesiveness formed between the device D and the second adhesive layer 22 may have the same size.

However, when the thickness of the first adhesive layer is smaller than a thickness of the second adhesive layer and greater applied pressure than the threshold applied pressure is applied to the carrier film 10 and the substrate 20, the first press fitting depth $d_{e1}$ by which the device D is press-fit into the first adhesive layer 12 may be smaller than the second press fitting depth $d_{e2}$ by which the device D is press-fit into the second adhesive layer 22.

One surface of the device D comes in contact with the base film 11 in the first adhesive layer 12 and is restrictedly moved, and the device D is moved and is press-fit without restrictions in the second adhesive layer 22, and thus, the second press fitting depth $d_{e2}$ may have a greater value than the first press fitting depth $d_{e1}$.

Due to such a difference between press fitting depths, a size of the second adhesiveness may be greater than the size $F_b$ of the first adhesiveness.

As shown in FIG. 10A, the thickness $t_{a1}$ of the first adhesive layer 12 may be smaller than the thickness $t_{a2}$ of the second adhesive layer 22, and greater applied pressure than the threshold applied pressure for press-fitting the device D by the thickness $t_{a1}$ of the first adhesive layer 12 may be applied to the carrier film 10 and the substrate 20.

Accordingly, the first press fitting depth $d_{f1}$ may be smaller than the second press fitting depth $d_{f2}$, and thus, the first adhesiveness may be smaller than the second adhesiveness, and as the releasing operation S40 is performed, the device D may be released from the first adhesive layer 12 in a state in which the device D is attached to the second adhesive layer 22, as shown in FIG. 10B.

The present invention is not limited thereto, and as shown in FIGS. 11A and 11B, the thickness $t_{b1}$ of the first adhesive layer 12 may be greater than the thickness $t_{b2}$ of the second adhesive layer 22, and greater applied pressure than the threshold applied pressure for press-fitting the device D by the thickness $t_{b2}$ of the second adhesive layer 22 may be applied to the carrier film 10 and the substrate 20.

Accordingly, the first adhesiveness of the device D may be greater than the second adhesiveness of the device D due to a difference between the first press fitting depth $d_{g1}$ and the second press fitting depth $d_{g2}$, and as the releasing operation S40 is performed, the device D may be released from the second adhesive layer 22 in a state in which the device D is attached to the first adhesive layer 12.

Resultantly, thicknesses of the first adhesive layer 12 and the second adhesive layer 22, and pressure applied to the carrier film 10 and the substrate 20 may be adjusted to control the press fitting depth of the device D, and thus, a direction in which the device D is transferred and released may be determined.

Figure 12A:
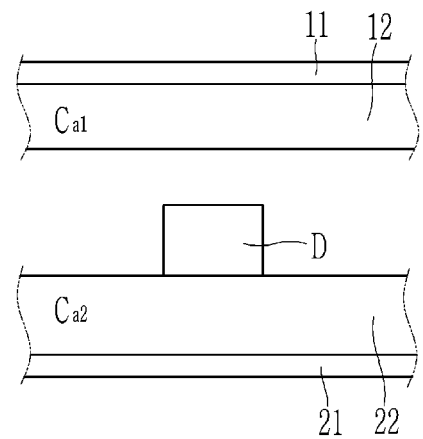
FIGS. 12A, 12B and 12C are diagrams of first and second adhesive layers of the device transfer method of FIG. 2 according to a fourth exemplary embodiment.
Figure 12B:
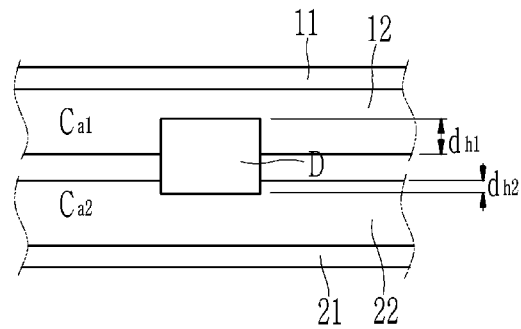
Figure 12C:
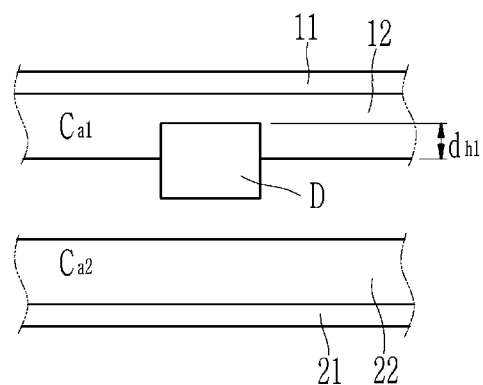
Figure 13A:
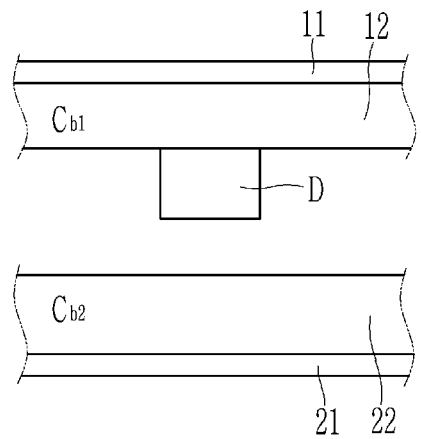
FIGS. 13A, 13B and 13C are diagrams of first and second adhesive layers of the device transfer method of FIG. 2 according to a modified example of the fourth exemplary embodiment.
Figure 13B:
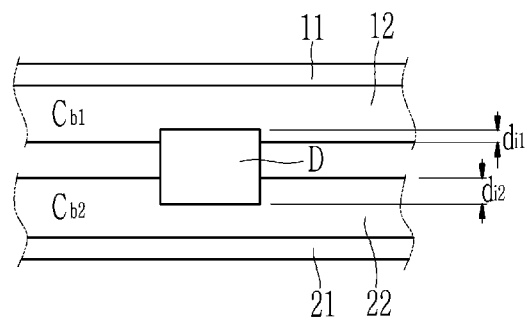
Figure 13C:
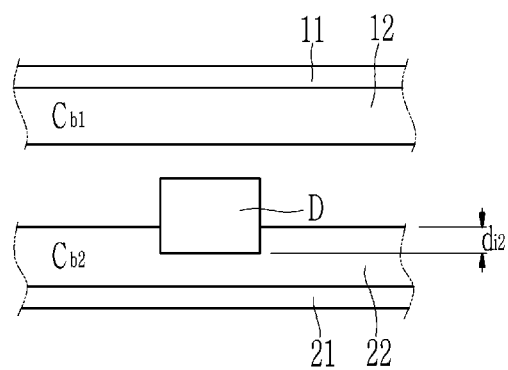

FIGS. 12A, 12B and 12C are diagrams of first and second adhesive layers of the device transfer method of FIG. 2 according to a fourth exemplary embodiment. FIGS. 13A, 13B and 13C are diagrams of first and second adhesive layers of the device transfer method of FIG. 2 according to a modified example of the fourth exemplary embodiment.

With reference to FIGS. 12A to 13C, the first adhesive layer 12 and the second adhesive layer 22 which have different thermosetting properties according to the fourth exemplary embodiment will be described below.

As shown in FIG. 12A, the device D may be attached to the second adhesive layer 22, the second adhesive layer 22 may be formed of a material that is hardened when being heated with a predetermined temperature or greater, and a heater for heating the second adhesive layer 22 may be disposed between the second adhesive layer 22 and the base surface 21 or may be disposed outside the substrate 20.

As shown in FIG. 12B, as a temperature $C_{a2}$ of the second adhesive layer 22 is increased by the heater, the second adhesive layer 22 may be hardened, and the first adhesive layer 12 may not be affected by heat and may not be hardened.

Accordingly, the first press fitting depth $d_{h1}$ may be greater than the second press fitting depth $d_{h2}$, the first adhesiveness may be greater than the second adhesiveness, and as the releasing operation S40 is performed, the device D may be released from the second adhesive layer 22 in a state in which the device D is attached to the first adhesive layer 12, as shown in FIG. 12C.

The present invention is not limited thereto, and as shown in FIG. 13A, the device D may be attached to the first adhesive layer 12, the first adhesive layer 12 may be formed of a material that is hardened when being heated with a predetermined temperature or greater, and a heater for heating the first adhesive layer 12 may be disposed between the first adhesive layer 12 and the base film 11 or may be disposed outside the carrier film 10.

As shown in FIG. 13B, as a temperature $C_{b1}$ of the first adhesive layer 12 is increased by the heater, the first adhesive layer 12 may be hardened, and the second adhesive layer 22 may not be affected by heat and may not be hardened.

Accordingly, the first press fitting depth $d_{i1}$ may be greater than the second press fitting depth $d_{i2}$, the first adhesiveness may be smaller than the second adhesiveness, and as the releasing operation S40 is performed, the device D may be released from the first adhesive layer 12 in a state in which the device D is attached to the second adhesive layer 22, as shown in FIG. 13C.

Resultantly, the first adhesive layer 12 or the second adhesive layer 22 may be formed of a material that is hardened by heat to control a press fitting depth of the device D, and thus, a direction in which the device is transferred and released may be determined.

The first adhesive layer 12 may be irradiated by light to be hardened.

Figure 14A:
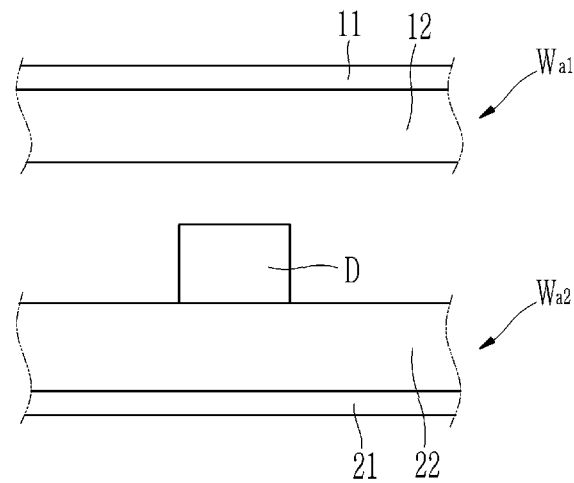
FIGS. 14A, 14B and 14C are diagrams of first and second adhesive layers of the device transfer method of FIG. 2 according to a fifth exemplary embodiment.
Figure 14B:
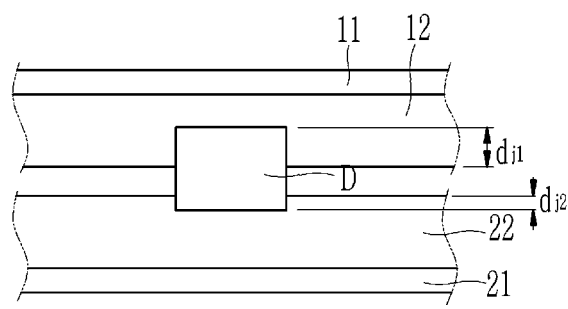
Figure 14C:
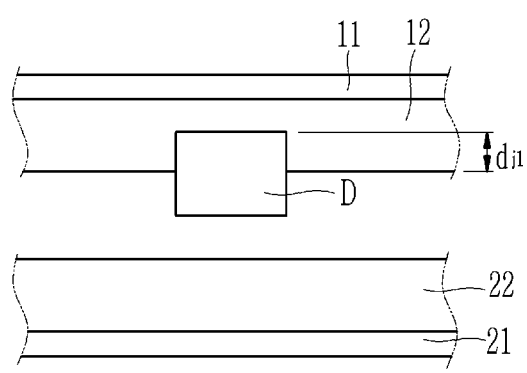
Figure 15A:
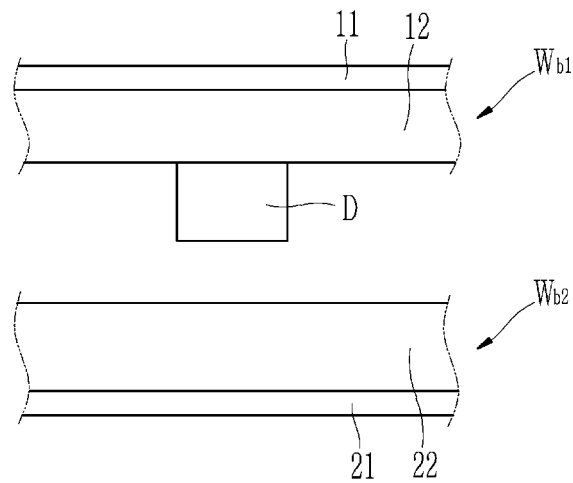
FIGS. 15A, 15B and 15C are diagrams of first and second adhesive layers of the device transfer method of FIG. 2 according to a modified example of the fifth exemplary embodiment.
Figure 15B:
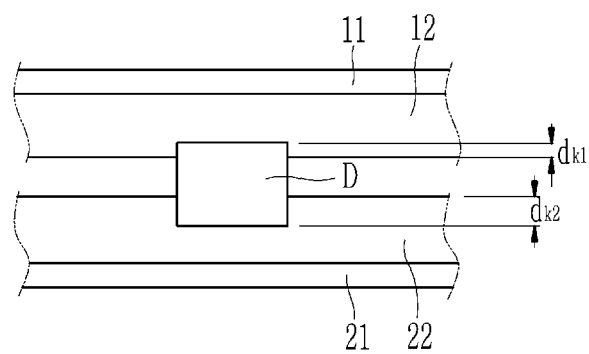
Figure 15C:
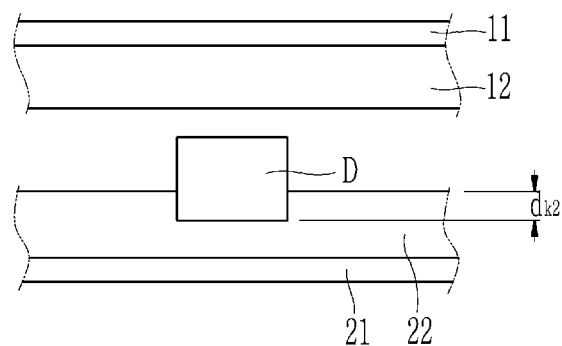

FIGS. 14A, 14B and 14C are diagrams of first and second adhesive layers of the device transfer method of FIG. 2 according to a fifth exemplary embodiment. FIGS. 15A, 15B and 15C are diagrams of first and second adhesive layers of the device transfer method of FIG. 2 according to a modified example of the fifth exemplary embodiment.

With reference to FIGS. 14A to 15C, the first adhesive layer 12 and the second adhesive layer 22 which have different hardening properties depending on wavelengths of light according to the fifth exemplary embodiment will be described below.

As shown in FIG. 14A, the device D may be attached to the second adhesive layer 22, and the first adhesive layer 12 and the second adhesive layer 22 may be formed of a material with a hardening degree that is changed depending on wavelengths of light.

As the first adhesive layer 12 and the second adhesive layer 22 are irradiated by light with a relatively short wavelength, a hardening degree may be further strengthened. For example, when an adhesive layer is irradiated by ultraviolet rays with a relatively short wavelength range, the adhesive layer may be further hardened compared with the case in which the adhesive layer is irradiated by visible rays with a relatively long wavelength range.

As shown in FIG. 14B, when a wavelength $W_{a1}$ of light emitted to the first adhesive layer 12 is longer than a wavelength $W_{a2}$ of light emitted to the second adhesive layer 22, as the second adhesive layer 22 is further hardened, the first press fitting depth $d_{j1}$ may be greater than the second press fitting depth $d_{j2}$ compared with the first adhesive layer 12, and accordingly, the first adhesiveness may be greater than the second adhesiveness.

Accordingly, as the releasing operation S40 is performed, the device D may be released from the second adhesive layer 22 in a state in which the device D is attached to the first adhesive layer 12, as shown in FIG. 14C.

The present invention is not limited thereto, and as shown in FIG. 15A, the device D may be attached to the first adhesive layer 12, and the first adhesive layer 12 and the second adhesive layer 22 may be formed of a material with a hardening degree that is changed depending on wavelengths of light.

As shown in FIG. 15B, when a wavelength $W_{b1}$ of light emitted to the first adhesive layer 12 is smaller than a wavelength $W_{b2}$ of light emitted to the second adhesive layer 22, as the first adhesive layer 12 is further hardened compared with the second adhesive layer 22, the first press fitting depth $d_{k1}$ may be smaller than the second press fitting depth $d_{k2}$, and thus, the first adhesiveness may be smaller than the second adhesiveness.

Accordingly, when the releasing operation S40 is performed, the device D may be released from the first adhesive layer 12 in a state in which the device D is attached to the second adhesive layer 22, as shown in FIG. 15C.

Resultantly, the first adhesive layer 12 and the second adhesive layer 22 may be formed of a material with a hardening degree that is changed depending on wavelengths of light to control a press fitting depth of the device D, and thus, a direction in which the device D is transferred and released may be determined.

Figure 17A:
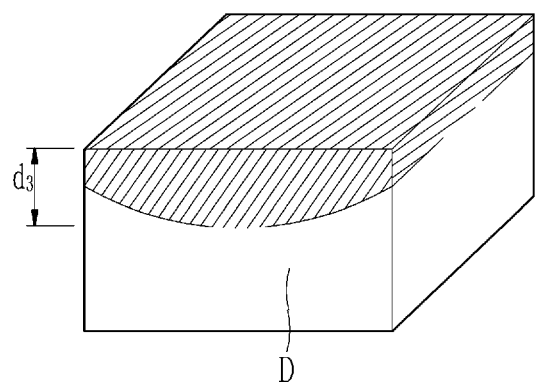
FIGS. 17A and 17B are diagrams for explanation of a difference in an adhesive region between a carrier film and a device when a device is press-fit into a conventional carrier film and into the carrier film of FIGS. 15A to 15C by the same press fitting depth.
Figure 17B:
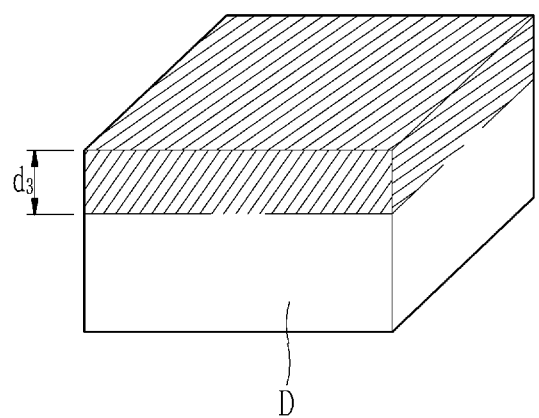

FIG. 16 is a diagram showing movement of a carrier film using a roller in the device transfer method of FIG. 2. FIGS. 17A and 17B are diagrams for explanation of a difference in an adhesive region formed between a carrier and a device when a device is press-fit into a conventional carrier film and into the carrier film of FIGS. 15A to 15C by the same press fitting depth.

As shown in FIG. 16, the carrier film 10 may be moved by being coupled to a roller R.

In detail, as the carrier film 10 is disposed to surround a cylindrical roller R and is rotated around a rotation axis of the roller R, the device D attached to the second adhesive layer 22 may be transferred to the first adhesive layer 12.

In this case, in the pressurization operation S10 in which the device D is pressurized to the carrier film 10 and the substrate 20, the first adhesive layer 12 may include a flat protrusion portion 12a that protrudes from a curved surface to press-fit an entire portion of one surface of the device D, which is adhered to the first adhesive layer 12, by a uniform depth.

When a depth by which the device D is press-fit into the first adhesive layer 12 with a conventional curved shape and a depth by which the device D is press-fit into the first adhesive layer 12 having the flat protrusion portion 12a are the same depth, that is, a depth $d_3$, a region of the device D, which is press-fit into the first adhesive layer 12 with a conventional curved shape shown in FIG. 17A, may be smaller than a region of the device D, which is press-fit into the flat protrusion portion 12a shown in FIG. 17B.

In detail, the device D shown in FIG. 17A may have a press fitting depth that is relatively reduced toward opposite sides from a central portion with a greatest press fitting depth $d_3$ according to a curved surface of the roller R, and thus, the first adhesiveness may be non-uniform, and on the other hand, the device D shown in FIG. 17B may be press-fit into the flat protrusion portion 12a by a uniform press fitting depth $d_3$ and the first adhesiveness may also be uniform.

Accordingly, the first adhesive layer 12 including the flat protrusion portion 12a may more stably release the device D from the second adhesive layer 22.

When the device D is moved generally using the roller R, a region that contacts the substrate 20 may be planarized by controlling load of the roller R. Accordingly, a size of a region of the first adhesive layer 12, which contacts the substrate 20, may be adjusted and the region of the first adhesive layer 12, which contacts the substrate 20, may be planarized simply by controlling contact load applied between the roller R and the substrate 20 without additional formation of the flat protrusion portion 12a on the roller R, and accordingly, the device D may be press-fit into the planarized region of the first adhesive layer 12 by a uniform press fitting depth.

In this case, the substrate 20 may be formed of a flat type. The present invention is not limited thereto, and the carrier film 10 may be formed of a flat type, and the carrier film 10 formed of a flat type may uniformize the first adhesiveness by forming a uniform press fitting depth between the device D and the first adhesive layer 12, thereby stably transferring the device.

Hereinafter, an electronic product manufacturing method in which a plurality of devices are transferred to a flat plate using the device transfer method according to the present invention to manufacture an electronic product will be described.

Here, the device may be a micro light emitting diode (LED) and the electronic product may be, in detail, a part type electronic product such as a circuit board including a flat type display or digital signage, or a completion type electronic product including the circuit board installed therein. The circuit board may be various well-known circuit boards such as a printed circuit board, a liquid crystal circuit board, a display panel circuit board, and a circuit board in a semiconductor chip, the printed circuit board may include any of well-known ductile, rigid, or rigid flexible circuit boards, and may be used to manufacture an electronic product using the aforementioned device transfer method according to the present invention.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

D: device
10: carrier film
11: base film
12: first adhesive layer
12a: flat protrusion portion
20: substrate
21: base surface
22: second adhesive layer
R: roller

The invention claimed is:

1. A device transfer method comprising:
pressurizing a carrier film including a base film and a first adhesive layer formed on one surface of the base film, and a substrate including a base surface and a second adhesive layer formed on the base surface against each other to permit the first adhesive layer and the second adhesive layer to face each other and to position a device as a transfer target between the first adhesive layer and the second adhesive layer, wherein a first thickness of the first adhesive layer is smaller than a second thickness of the second adhesive layer;
forming a first adhesiveness between the device and the first adhesive layer as the device is press-fit into the first adhesive layer via the pressurizing;
forming a second adhesiveness between the device and the second adhesive layer as the device is press-fit into the second adhesive layer via the pressurizing; and
releasing the device from the first adhesive layer by spacing the carrier film apart from the substrate,
wherein
the first adhesiveness is proportional to a first press fitting depth by which the device is press-fit into the first adhesive layer, and the second adhesiveness is proportional to a second press fitting depth by which the device is press-fit into the second adhesive layer, and the device is moved between the first adhesive layer and the second adhesive layer by a relative difference between the first press fitting depth and the second press fitting depth, wherein the pressurizing includes applying greater pressure than a threshold applied pressure for press-fitting the device by the first thickness of the first adhesive layer, to the carrier film and the substrate, and the second press fitting depth is greater than the first press fitting depth, and wherein the first press fitting depth is equal to the first thickness of the first adhesive layer.

2. The method of claim 1, wherein a viscoelastic coefficient of the first adhesive layer and a viscoelastic coefficient of the second adhesive layer are.

3. The method of claim 1, wherein yield strength of the first adhesive layer and yield strength of the second adhesive layer are different from each other.

4. The method of claim 1, wherein the first adhesive layer or the second adhesive layer is formed of a material with a hardening degree that is changed depending on heat applied to the first adhesive layer or the second adhesive layer.

5. The method of claim 1, wherein the first adhesive layer and the second adhesive layer are formed of a material with a hardening degree that is changed depending on wavelengths of light applied to the first adhesive layer and the second adhesive layer.

6. The method of claim 1, wherein:

the carrier film is disposed to surround a cylindrical roller; and the carrier film comprises a flat protrusion portion protruding from a curved surface of the first adhesive layer so that an entire portion of one surface of the device is press-fit into the second adhesive layer via the pressurizing, by a uniform depth.

7. A method comprising transferring a plurality of devices on a flat plate using a device transfer method, the device transfer method comprising:

pressurizing a carrier film including a base film and a first adhesive layer formed on one surface of the base film, and a substrate including a base surface and a second adhesive layer formed on the base surface against each other to permit the first adhesive layer and the second adhesive layer to face each other and to position a device as a transfer target between the first adhesive layer and the second adhesive layer, wherein a first thickness of the first adhesive layer is smaller than a second thickness of the second adhesive layer;

forming a first adhesiveness between the device and the first adhesive layer as the device is press-fit into the first adhesive layer via the pressurizing;

forming a second adhesiveness between the device and the second adhesive layer as the device is press-fit into the second adhesive layer via the pressurizing; and releasing the device from the first adhesive layer or the second adhesive layer by spacing the carrier film apart from the substrate, wherein the first adhesiveness is proportional to a first press fitting depth by which the device is press-fit into the first adhesive layer, and the second adhesiveness is proportional to a second press fitting depth by which the device is press-fit into the second adhesive layer, and the device is moved between the first adhesive layer and the second adhesive layer by a relative difference between the first press fitting depth and the second press fitting depth, wherein the pressurizing includes applying greater pressure than threshold applied pressure for press-fitting the device by the first thickness of the first adhesive layer with a smaller thickness among the first adhesive layer and the second adhesive layer, to the carrier film and the substrate, and the second press fitting depth is greater than the first press fitting depth, and wherein the first press fitting depth is equal to the first thickness of the first adhesive layer.

\* \* \* \* \*